United States Patent
Howard

(10) Patent No.: US 10,938,488 B2
(45) Date of Patent: Mar. 2, 2021

(54) SYSTEM AND METHOD FOR MEASURING FREE-SPACE PARAMETERS OF AN ANTENNA

(71) Applicant: Keysight Technologies, Inc., Santa Rosa, CA (US)

(72) Inventor: Michael W. Howard, Kimballton, IA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/826,424

(22) Filed: Mar. 23, 2020

(65) Prior Publication Data

US 2020/0220627 A1    Jul. 9, 2020

Related U.S. Application Data

(63) Continuation of application No. 15/618,545, filed on Jun. 9, 2017, now Pat. No. 10,630,397.

(51) Int. Cl.
| | |
|---|---|
| *G01R 27/28* | (2006.01) |
| *G01R 31/11* | (2006.01) |
| *G01R 35/00* | (2006.01) |
| *H04B 17/10* | (2015.01) |
| *G01R 29/10* | (2006.01) |

(52) U.S. Cl.
CPC ........ *H04B 17/102* (2015.01); *G01R 27/28* (2013.01); *G01R 29/10* (2013.01); *G01R 29/105* (2013.01); *H04B 17/103* (2015.01)

(58) Field of Classification Search
CPC ........ G01R 27/28; G01R 31/11; G01R 35/00; G06F 11/34; H04B 17/10; H04B 17/102; H04B 17/27; H04B 7/18506
See application file for complete search history.

(56) References Cited

U.S. PATENT DOCUMENTS

| | | | |
|---|---|---|---|
| 7,170,297 B1 | 1/2007 | Dunsmore | |
| 8,612,581 B1* | 12/2013 | Craig | H04B 7/18506 709/224 |
| 2003/0222811 A1 | 12/2003 | Halsey et al. | |
| 2007/0042772 A1 | 2/2007 | Salkini et al. | |
| 2009/0102743 A1* | 4/2009 | Hager | E04H 12/003 343/890 |
| 2014/0149074 A1* | 5/2014 | Whetten | G01R 29/0835 702/182 |
| 2015/0288073 A1* | 10/2015 | Hall | H01Q 17/00 342/2 |
| 2015/0309160 A1* | 10/2015 | Giunta | G01H 9/00 342/118 |
| 2016/0269917 A1 | 9/2016 | Hillegas, Jr. et al. | |
| 2017/0208597 A1* | 7/2017 | Gollakota | H04W 24/08 |
| 2018/0033320 A1 | 2/2018 | Castelli et al. | |
| 2018/0083726 A1* | 3/2018 | Mitton, Jr. | H04W 48/16 |
| 2018/0356333 A1* | 12/2018 | Shehri | G01R 27/28 |

* cited by examiner

Primary Examiner — Neel D Shah

(57) ABSTRACT

Disclosed is a system for measuring free space properties of an antenna. The system includes an analyzer adapted to obtain from an antenna supported in the air by an aircraft, at least one property of the antenna, and to determine at least one property of the antenna. The system also includes a telemetry unit adapted to relay information from the analyzer to a ground station.

17 Claims, 8 Drawing Sheets

SYSTEM AND METHOD FOR MEASURING FREE-SPACE PARAMETERS OF AN ANTENNA

CROSS REFERENCE TO RELATED APPLICATIONS

This application is a continuation under 37 C.F.R. § 1.53(b)(1) of commonly owned U.S. patent application Ser. No. 15/618,545 to Howard, et al. entitled "System and Method for Measuring Free-Space Parameters of an Antenna" filed on Jun. 9, 2017. The present application claims priority under 35 U.S.C. § 120 to U.S. patent application Ser. No. 15/618,545, the disclosure of which is hereby incorporated by reference in its entirety.

BACKGROUND

1. Field

Example embodiments relate to systems and methods for measuring the free-space parameters of an antenna.

2. Description of the Related Art

Common methods for measuring free-space or near free-space parameters of an antenna employ anechoic chambers, elevated ranges, compact ranges, and slant ranges. Each of these methods have various advantages/disadvantages.

Anechoic chambers typically have walls, a ceiling, and a floor lined with special electromagnetic wave absorbing materials. The special electromagnetic wave absorbing materials are often in the form of jagged triangles designed to reflect electromagnetic waves in random directions to suppress their effects during a measurement step. Anechoic chambers suffer several drawbacks. First, the special electromagnetic wave absorbing materials are relatively expensive. Second, the materials cannot fully eliminate reflections in the chamber. Third, anechoic chambers are generally only usable for antennas having frequencies of 300 MHz or higher. Fourth, the chambers are generally designed only for small antennas.

Elevated ranges utilize a source antenna and a test antenna mounted above the ground. The antennas can be on towers, buildings, hills, or mountains, however, a line of sight between the antennas must be unobstructed. Reflections from the ground are undesirable, as such, artisans generally locate where the significant reflections occur and attempt to minimize the reflections from these surfaces. For example, RF absorbing materials are often provided at the reflection locations in order to minimize their effect. This, of course, can add significant cost to the test and does not guarantee ground reflections will be eliminated.

Compact ranges employ a source antenna placed in a far field of a test antenna. This technique may be applied indoors or outdoors. For indoor chambers there is often not enough separation between the source antenna and test antenna to place the test antenna in a far field. To compensate for this, a source antenna is often oriented towards a reflector, for example, a parabolic mirror, whose shape is designed to reflect the source's wave in an approximately planer manner. A length of the reflector is typically several times larger than the test antenna. In this technique, care must be taken to offset the source antenna so that it is not in the way of the reflected wave pattern. Furthermore, care must be taken to prevent any direct radiation from the source to the test antenna. Compact ranges are generally usable for only small antennas.

Slant ranges use a test antenna mounted on a relatively large structure, for example, a fiberglass tower. A main radiating beam from the test antenna is directed to a source antenna which may be on the ground. Size and weight of the test antenna is restricted to the capability of the tower and interaction with the materials used to construct the tower. In most cases, the tower must be made of a non-conductive material which has a higher cost associated with it.

While the above methods are usable for determining free-space parameters of an antenna, each suffers errors associated with phase, amplitude, and ripples due to their deviations from ideal test conditions. What is needed is a new and improved method of measuring free-space properties of an antenna that does not suffer the above mentioned drawbacks.

SUMMARY

Example embodiments relate to systems and methods for measuring free-space parameters of an antenna.

In example embodiments, a method for measuring free space properties of an antenna may include supporting the antenna above the ground by an aircraft and using an analyzer to determine at least one property of the antenna while the antenna is suspended in the air. In example embodiments, the method may further include a flying drone around the antenna while the antenna is suspended and using the drone to take measurements of the antenna.

BRIEF DESCRIPTION OF THE DRAWINGS

Example embodiments are described in detail below with reference to the attached drawing figures, wherein.

DETAILED DESCRIPTION

Figure 1:
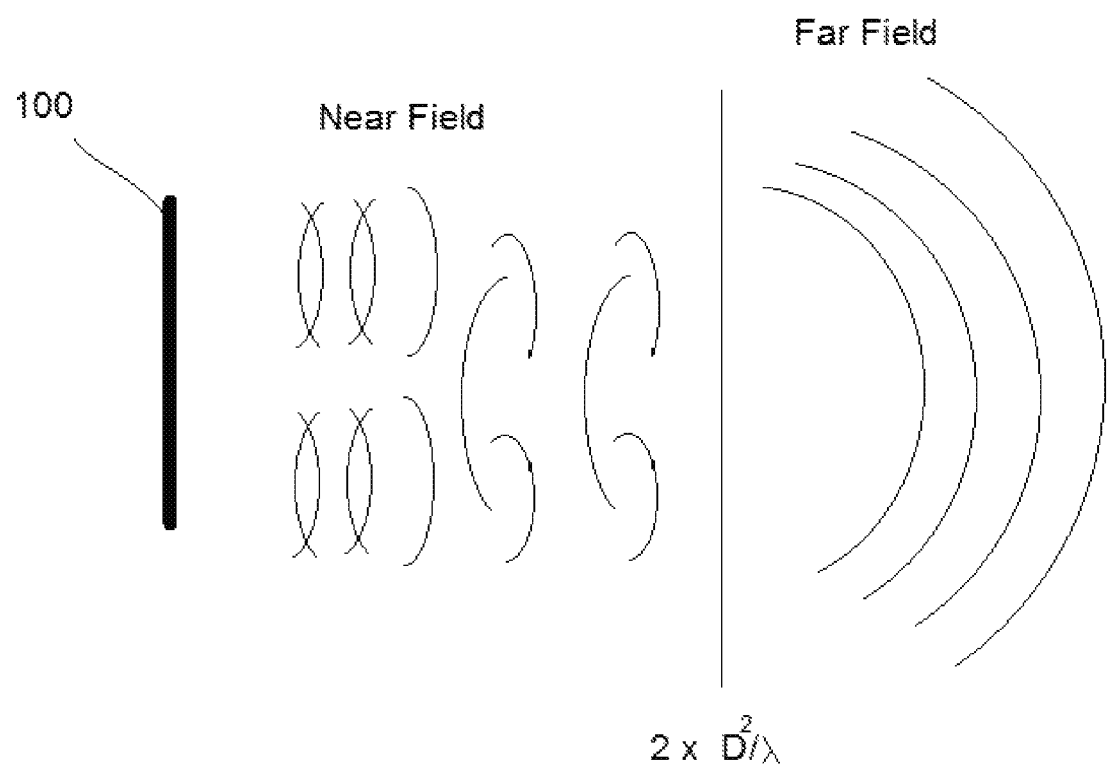
FIG. 1 is a view illustrating near and far fields associated with an antenna.

The drawings in this application show one or more example embodiments of the invention and are provided to aid those skilled in the art to understand the invention. The invention, however, may be embodied in different forms and should not be construed as limited to the example embodiments illustrated in the drawings. In the drawings, the sizes of components may be exaggerated for clarity.

In this application various elements may be described as being "on," "connected to," or "coupled to" another element. Elements described as being "on", "connected to" or "coupled to" another element can be directly on, directly connected to, or coupled to the other element or any elements there between. Elements described as being "directly on," "directly connected to," or "directly coupled to" another element, however, have no intervening element between it and the other element. In this application it is understood the term "and/or" includes any and all combinations of one or more of the associated listed items.

In this application the terms first, second, etc. are used to describe various elements and/or regions. The terms first, second, etc., however, are not intended to limit the elements and/or regions they are associated with. Rather, the terms first, second, etc. are only used to distinguish one element and/or region from another element and/or region. For example, a first element could be termed a second element or even a third element without departing from the teachings of example embodiments.

In this application, spatially relative terms are used for ease of description to describe one element's relationship to another as illustrated in the figures. It is understood that the spatially relative terms are intended to encompass different orientations. For example, if a structure in the figures is turned over, elements described as "below" other elements would then be oriented "above" the other elements. Thus, the spatially relative term "below" can encompass both an orientation of above and below.

Embodiments are often presented in ideal schematic and cross-section views. As such, examples illustrated in the figures have schematic properties. Furthermore, the shapes of elements and regions illustrated in the figures merely exemplify shapes and of elements and regions and are not intended to limit the invention.

The description of the example embodiments is not intended to limit the scope of this patent as the claimed subject matter might be embodied in many ways to include different features or combination of features similar to those described herein. Rather, the description of the example embodiments is provided to meet statutory requirements. Generally, example embodiments relate to a system and method for measuring free-space properties of an antenna.

FIG. 1 represents near-field and far-field regions of an electromagnetic field around a transmitting antenna 100. As one skilled in the art would readily recognize, "near-field" behaviors of an electromagnetic field dominate close to the antenna 100 while "far-field" (radiative) behaviors dominate at greater distances. From a quantitative perspective, near-field is that part of a radiated field below a distance shorter than the Fraunhofer distance which is defined as $d_f = 2D^2/\lambda$ where D represents either a diameter or length of an antenna and $\lambda$ is the wavelength of the electromagnetic field. Of course, one skilled in the art would also recognize that $\lambda$ may be calculated as the speed of light (about $3 \times 10^8$ m/sec) divided by the frequency of the electromagnetic field in HZ generated by the antenna 100.

Figure 2:
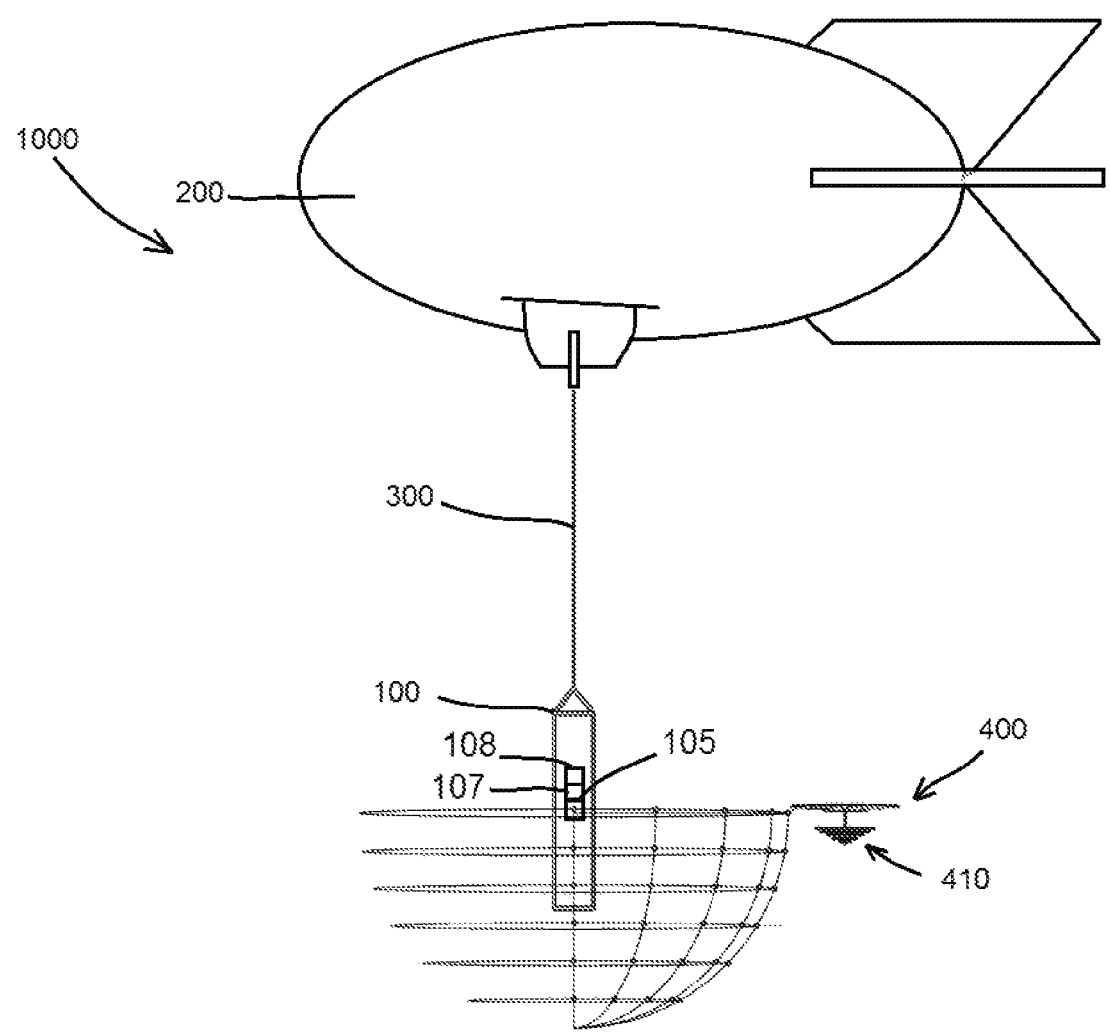
FIG. 2 is a view of a system in accordance with example embodiments.

FIG. 2 illustrates a system 1000 in accordance with example embodiments. As shown in FIG. 2, the system 1000 includes an antenna 100 suspended by an aircraft 200 via a cable 300. By way of example only, the aircraft 200 may be an aerostat (a balloon configured to face a wind) or another type of balloon. However, the aircraft 200 may alternatively be a powered aircraft, for example, a helicopter or drone.

In example embodiments, the aircraft 200 may be configured to suspend the antenna 100 at a sufficient distance above the ground during a measurement test so that free-space electrical properties of the antenna 100 may be measured. As one skilled in the art would readily appreciate, ground effects on an antenna dissipate the farther the antenna is moved from the ground. As such, so long as the antenna 100 is sufficiently separated from the ground, free space electrical characteristics of the antenna 100 may be obtained. To avoid the effects of ground interference, the antenna 100 may be suspended about a Fraunhofer distance, or greater, from the ground.

In example embodiments, an analyzer 105 may be coupled to the antenna 100. The analyzer 105 may take measurements of the antenna 100 while the antenna 100 is suspended above the ground. The analyzer 105 may, for example, be a software defined radio (SDR) vector network analyzer (VNA). In one embodiment, the analyzer 105 includes a power source, for example, a battery, to power the analyzer 105. This embodiment avoids having to run a power cable from a power source, for example, on the ground, to the analyzer 105. In example embodiments, the analyzer 105 may be arranged at a focal point of the antenna 100 and may be used to measure various properties of the antenna 100. For example, the analyzer 105 may be configured to measure the S11 parameter of the antenna 100. As one skilled in the art would recognize, the S11 parameter of an antenna is a measurement of reflected power a radio is trying to deliver to the antenna 100. In example embodiments, the antenna 100 may further include a telemetry unit 107 configured to relay information from the analyzer 105 to a ground station. In the alternative, the analyzer 105 may be connected to a memory, for example, a RAM or ROM chip, to which measurement data may be written and retrieved. Of course, in example embodiments, the system 1000 may include both the telemetry unit 107 and memory.

In example embodiments, a global positioning device 108 may be arranged with the antenna 100 so that a position of the antenna 100 may be known. For example, the antenna 100 may include a differential RTK device to provide GPS coordinates of the antenna 100.

As shown in FIG. 2, the system 1000 may further include a drone 400. The drone 400 may be usable to measure various characteristics of the antenna 100. For example, the drone 400 may include equipment usable for determining a radiation pattern or gain from the antenna 100 and may be moved around the antenna 100 to collect this information while the antenna 100 is suspended from the aircraft 200. The drone 400, for example, may include an antenna 410 along with an analyzer 420 and a mini-pc 430 with telemetry to collect the measurement data of the antenna 100. In one embodiment, the analyzer 420 may be a signal hound spectrum analyzer, the antenna 410 may be a Schwarzbeck antenna, and the mini-pc 430 may be a Kangaroo PC. These particular elements may be useful in measuring the amplitude of a signal generated by antennas 100 having a frequency range of 9 kHz to about 300 MHz. The analyzer 420 may be modified, for example, with a downconverter, to increase the frequency ranges it may analyze to up to 40 GHz. The drone 400 may also include additional antennas usable in the frequency ranges of 300 MHz to about 40 GHz. It is understood that one skilled in the art would know how to select the appropriate analyzer, antenna, and mini-pc for the frequency range of measurement based on the antenna 100. Additionally, the drone 400 may include a global positioning device 440 in order to determine, at any time, the position of the drone 400 relative to the antenna 100. The global positioning device 440, for example, may be a differential RTK device to provide GPS coordinates where various measurements are made in relationship to the antenna 100. In at least one nonlimiting example embodiment, the drone 400 may further include a second GPS system.

In example embodiments, the drone 400 and payload may be calibrated. For example, the complete drone system 400 with antenna/analyzer 410/420 payload may be calibrated as a system using ANSI C63.5 and CISPR 16-1-1 for a three antenna method to obtain the ACF (Antenna Correction Factor) and Gain of the on board antenna that is part of the Drone payload. Any influences the drone 400 will have on the antenna incorporated into the drone system will be negated with this calibration. To inventor's knowledge, no one has ever calibrated the whole drone system but only the items in the payload separately.

Figure 3:
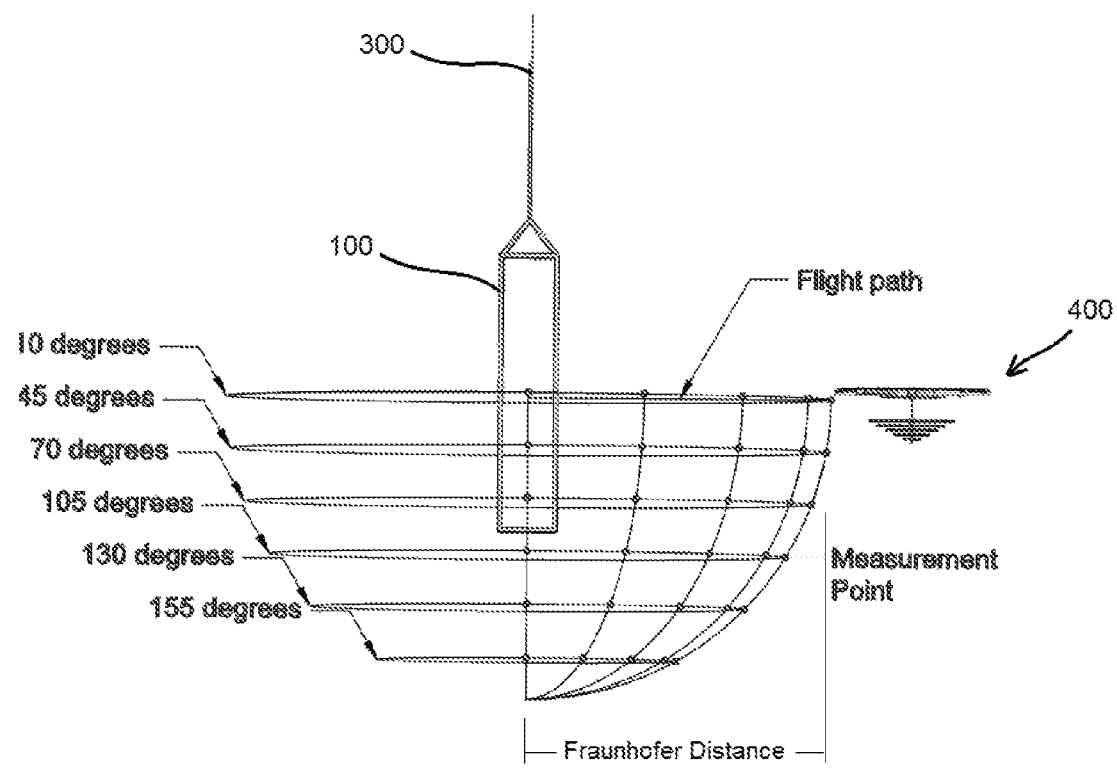
FIG. 3 is a close up view of the system showing a flight pattern of a drone in accordance with example embodiments.

As explained above, the drone 400 may fly around the antenna 100 and take measurements while the antenna 100 is suspended from the aircraft 200. This may allow for relatively accurate free space antenna pattern measurements of high frequency, very high frequency, ultrahigh frequency, and super high frequency antennas. In one nonlimiting example embodiment, the drone 400 may fly in a flight pattern, for example, a semi-hemispherical pattern, around the antenna 100 as shown in FIGS. 2 and 3. In at least one embodiment, a center of the pattern is coincident with the focal point of the antenna 100. As shown in FIG. 3, the drone 400 may take measurements, for example, signal strength from the antenna 100, at various points around the antenna 100.

Figure 5A:
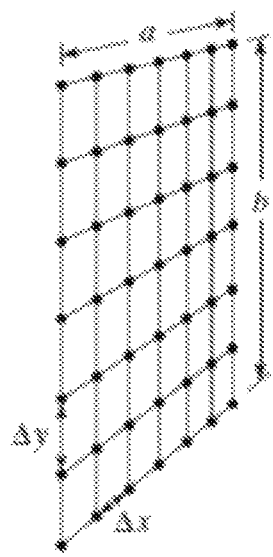
FIGS. 5A-5C are views of example flight patterns in accordance with example embodiments.
Figure 5B:
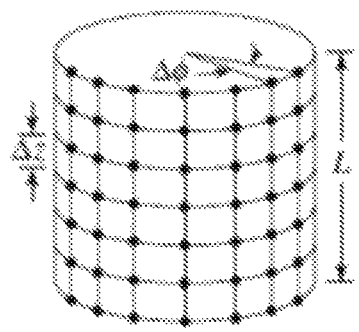
Figure 5C:
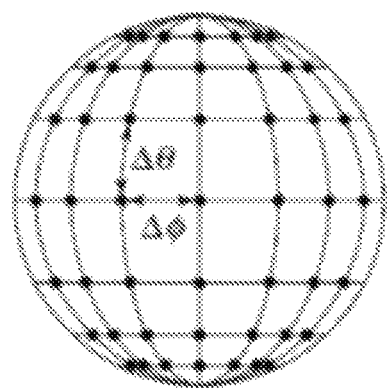

Although FIGS. 2-3 illustrate the drone 400 as flying in a hemispherical pattern, the invention is not limited thereto. FIGS. 5A, 5B, and 5C, for example, show other nonlimiting flight patterns. FIG. 5A, for example, illustrates a planer scanning pattern. In FIG. 5A the black dots represent points where the drone may take a measurement, symbols ΔX and ΔY illustrate spacings between the measurement points, and symbols "a" and "b" represent a length and a width of the rectangular plane. Although FIG. 5A illustrates the planer flight pattern as having a rectangular shape where measurements are taken at regular spacings, the invention is not limited thereto. For example, measurements may be taken at irregular spacings or logarithmic spacings and the perimeter of the plane may resemble something other than a rectangle, for example, a polygon, a circle, or even an ellipse.

FIG. 5B illustrates a cylindrical flight pattern having a length L where measurements taken by the drone 400, represented by the black dots, form a cylindrical pattern. In FIG. 5B the measurements are illustrated as being taken at a regular spacing. For example, in FIG. 5B, ΔZ represents a difference between measurements in a vertical direction and Δφ represents an angle formed between measurement points. The regularity of measurement points, however, is not meant to limit the invention. For example, the measurement points may form a cylinder but may have irregular spacings. In the example of FIG. 5B, the antenna 100 may be suspended so that its focal point is at a center/middle of the cylindrical pattern.

FIG. 5C illustrates a spherical flight pattern where the measurement points taken by a drone 400 are illustrated by black dots. In FIG. 5C symbols 66 φ and Δθ represent angles taken between measurement points. In the example of FIG. 5C, the focal point of the antenna 100 may be at a center of the spherical flight pattern. In FIG. 5C the measurement points are regular, however, the regularity of measurement points is not meant to limit the invention. For example, the measurement points may form a sphere but have irregular spacings.

In view of the above, a novel system 1000 for measuring free space properties of an antenna 100 is provided. In this system 1000, the antenna 100 may be tethered to the aircraft 200 via a cable 300. In one nonlimiting example embodiment, the antenna 100 is supported vertically to position nulls of the antenna's radiation pattern downwards in the direction of the ground and upwards in the direction of the aircraft 200. Positioning the pattern nulls in this axis may minimize interaction between the antenna 100 and the ground and between the antenna 100 and the aircraft 200. In this nonlimiting example embodiment, the aircraft 200 may lift the antenna 100 to an elevation so that the ground has relatively little influence on the properties of the antenna. For example, the aircraft 200 may lift the antenna 100 at least a Fraunhofer distance from the ground. For example, in one nonlimiting example embodiment, the aircraft 200 is an aerostat which is controlled to have a height above the ground of about five hundred (500) feet and a cable length of about fifty (50) feet above the ground so that a top of the antenna 100 is about four hundred and fifty (450) feet above the ground. Regardless, when the antenna 100 is elevated sufficiently above the ground, the analyzer 105 may be operated to determine various electrical parameters of the antenna 100. For example, the analyzer 105 may measure the S11 component of the antenna which, of course, may be used to determine a VSWR (Voltage Standing Wave Ratio) and Free Space Input Impedance of the antenna 100. In addition, the antenna 100 may be equipped with a signal source, for example, a continuous wave signal source, to energize and/or resonate the antenna 100. The drone 400 may be flown around the antenna 400 to take various measurements of the signal generated by the antenna 100 to better characterize the antenna 100. For example, the drone 400 may take measurements related to the antenna's gain and/or strength at various locations around the antenna 100.

In example embodiments the drone 400 may be controlled so that it takes measurements in the far field with respect to a signal generated by the antenna 100. By way of example only, if the antenna 100 is generating a signal with a frequency of 400 MHz the wavelength of the electromagnetic radiation emitted by the antenna 100 is $(3\times10^8$ m/sec$)/(4\times10^8$ Hz$)=0.75$ m. If the antenna has a length of 10 m the Fraunhofer distance may be calculated as $2*(10$ m$)^2/(0.75$ m$)=266$ m. As such, when the drone 400 takes measurements of a signal generated by the antenna 100, the drone 400 should take the measurements about 266 m, or larger, from the antenna 100. Of course, this also implies the antenna 100 should also be elevated about 266 m from the ground, or higher, to reduce the effects of the ground on the antenna 100. In the case of a spherical, hemispherical, or cylindrical flight pattern, the radius of the spherical, hemispherical, or cylindrical flight pattern, in this case, should be about 266 m or larger.

In example embodiments, the aforementioned system and method may be used to determine the free space parameters of various types of antennas, including, but not limited to, high frequency, very high frequency, ultra high frequency, and super high frequency antennas. For example, dipole antennas, loop antennas, folded dipole antennas, biconical antennas, log-periodic antennas, bi-log antennas, double ridge wave guide antennas, and horn antennas are just a few examples of antennas which may be measured by the above described system and method.

Figure 6:
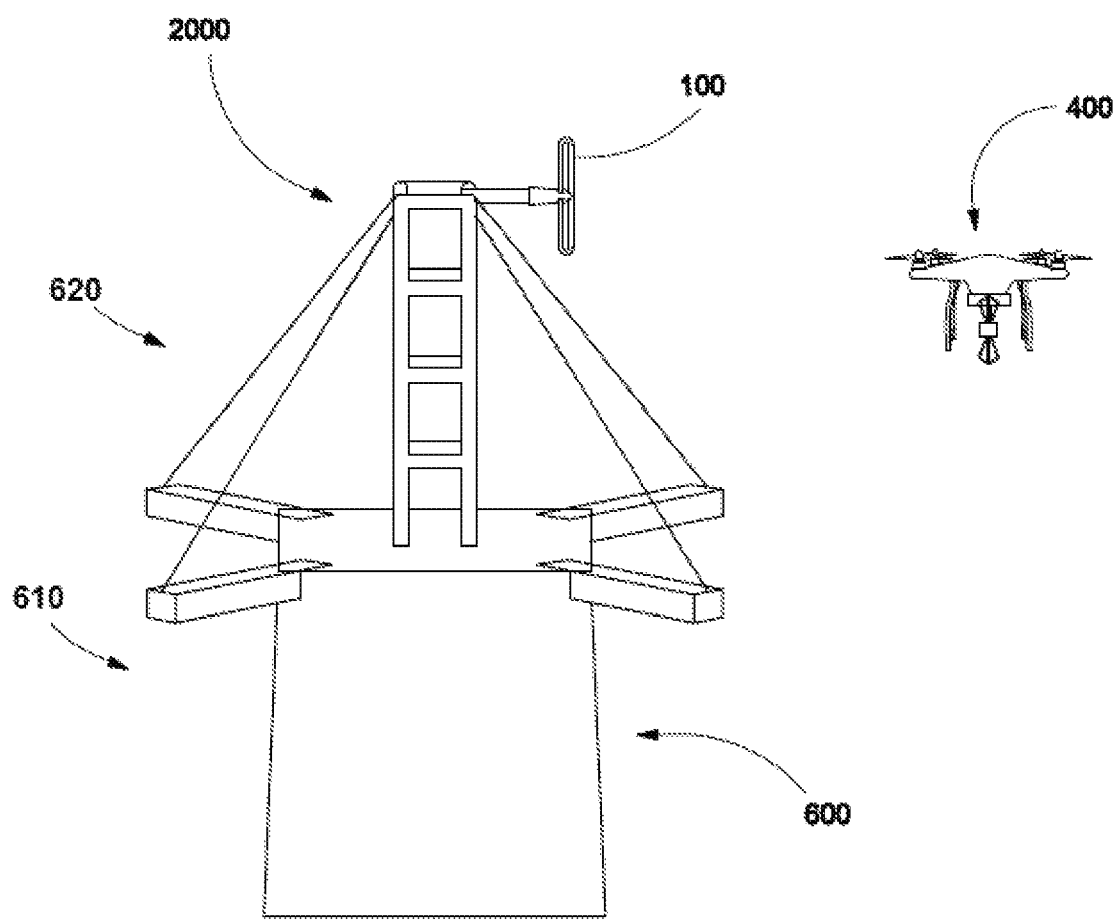
FIG. 6 is a view of another system in accordance with example embodiments.

FIG. 6 is a view of a system 2000 usable for measuring the free-space properties of an antenna 100. In FIG. 6, the system 2000 is illustrated as comprising a tower 600 configured to support an antenna 100. The tower 600 may be comprised of a first substructure 610 and a second substructure 620. The first and second substructures 610 and 620 may be made of a nonconductive materials, for example, wood or plastic, to minimize the interaction the tower 600 may have on the antenna 100. The heights of the first and second substructures may vary. In one nonlimiting example embodiment, the first substructure 610 is made of wood has a height of about forty five feet and the second substructure 620 is made of PVC and has a height of about sixty feet. These heights allow the antenna 100 to be supported off the ground at least one hundred and five feet. This particular example works well for antennas having a frequency of 50 MHz or higher. Of course, the dimensions provided above are merely exemplary and the actual heights of the substructures 610 and 620 may vary according to the size and type of antenna 100 being tested.

The system 2000 may further include a drone 400 configured to measure various parameters associated with the antenna 100. In this nonlimiting example, the antenna 100 may be substantially identical to the previously described antenna 100 of FIGS. 2-3 and the drone 400 may be substantially identical to the previously described drone 400. For example, the antenna 100 of FIG. 6 may include an analyzer 105, a telemetry unit 107, a global positioning device 108, and a signal generator which may be used as previously described. Similarly, the drone 400 may include an antenna 410 along with an analyzer 420 and a mini-pc 430 with telemetry to collect the measurement data of the antenna 100. However, in the system 2000, it is not critical for the antenna 100 to have a global positioning device 108 or its own power source since locating of the antenna 100 may be easily ascertained and since it would be relatively easy to provide a power cable to the antenna 100 due to it being mounted on tower 600. In the system 2000 the drone 400 may fly around the antenna 100 to collect various measurements as previously described.

In FIG. 6, the antenna 100 should be spaced far enough from the ground to reduce the effects of the ground on the antenna 100. Thus, as in the previous example, it is particularly advantageous to size the tower 600 so the antenna 100 is supported about a Fraunhofer distance or greater from the ground. A particular benefit of system 2000 over 1000 is that the system 2000 may be configured to support relatively large and heavy antennas that may not be easily supported by the aircraft 200.

Figure 7:
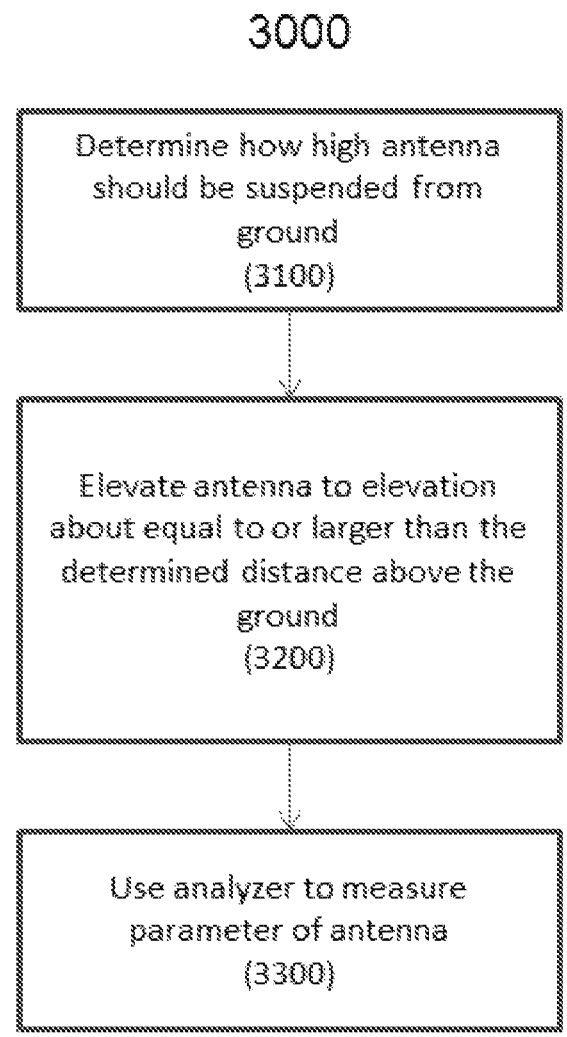
FIG. 7 is a flowchart illustrating an example method of measuring free-space properties of an antenna.
Figure 8:
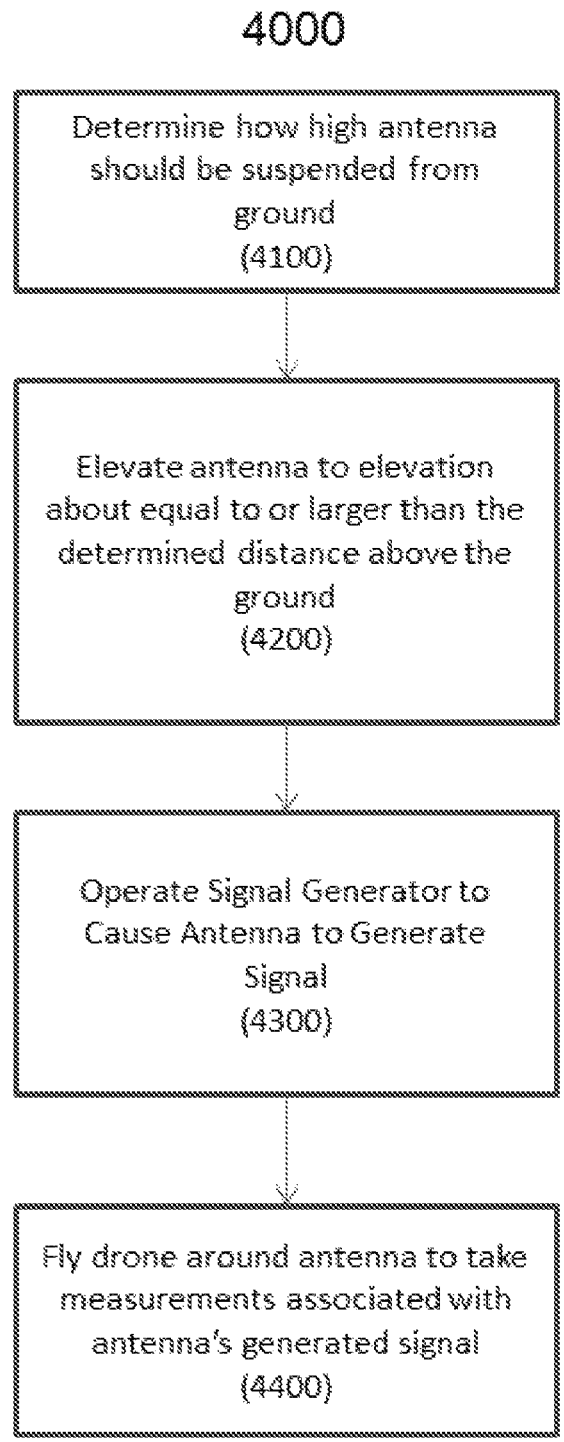
FIG. 8 is a flowchart illustrating an example method of measuring free-space properties of an antenna.

FIGS. 7 and 8 illustrate flowcharts associated with the instant disclosure. FIG. 7 for example, illustrates a method 3000 associated with measuring various properties of an antenna in free-space. These properties could include a VSWR (Voltage Standing Wave Ratio) and Free Space Input Impedance of the antenna in free-space. FIG. 8 illustrates a method 4000 usable for measuring the antenna's gain and/or strength.

In FIG. 7, the method 3000 may begin with a determination 3100 as to how high the antenna should be suspended above the ground during the measurement test. As previously described, this may be determined by using the Fraunhofer distance which is a function of the size of the antenna (D) and the operating frequency of the antenna. The height of the antenna (i.e. distance above the ground) should be about equal to or greater than Fraunhofer distance. After the height is determined, the antenna should be elevated to the required height 3200 or higher. This may be accomplished by attaching the antenna to an aircraft as illustrated in FIG. 2 or by attaching the antenna to a tower as shown in FIG. 6. Once the antenna is supported at the proper height, an analyzer on the antenna may be activated to measure various free-space parameters of the antenna 3300. For example, the analyzer may be, but is not required to be, the aforementioned SDR-VNA which can measure the S11 of the antenna.

In FIG. 8, the method 4000 may begin with a determination 4100 as to how high the antenna should be suspended above the ground during the measurement test. As previously described, this may be determined by using the Fraunhofer distance which is a function of the size of the antenna (D) and the operating frequency of the antenna. The height of the antenna should be about equal to or greater than Fraunhofer distance. After the height is determined, the antenna should be elevated to the required height 4200 or higher. This may be accomplished by attaching the antenna to an aircraft as illustrated in FIG. 2 or by attaching the antenna to a tower as shown in FIG. 6. Once the antenna is supported at the proper height, a signal generator may be activated which causes the antenna to generate a signal 4300. The signal generator may be the previously described continuous wave signal source, to energize and/or resonate the antenna. The method may then utilize a drone to fly around the antenna and take various measurements 4400. For example, the drone may be equipped with the previously described antenna 410, analyzer 420 and mini-pc 430 to collect the measurement data of the antenna 100. The data, for example, may be associated with the amplitude of a signal generated by the antenna under the influence of the signal generator. While taking measurements, the drone may be controlled so that the measurements are taken at about the Fraunhofer distance or greater from the antenna to make sure the drone is taking measurements in the antenna's far field.

Figure 4:
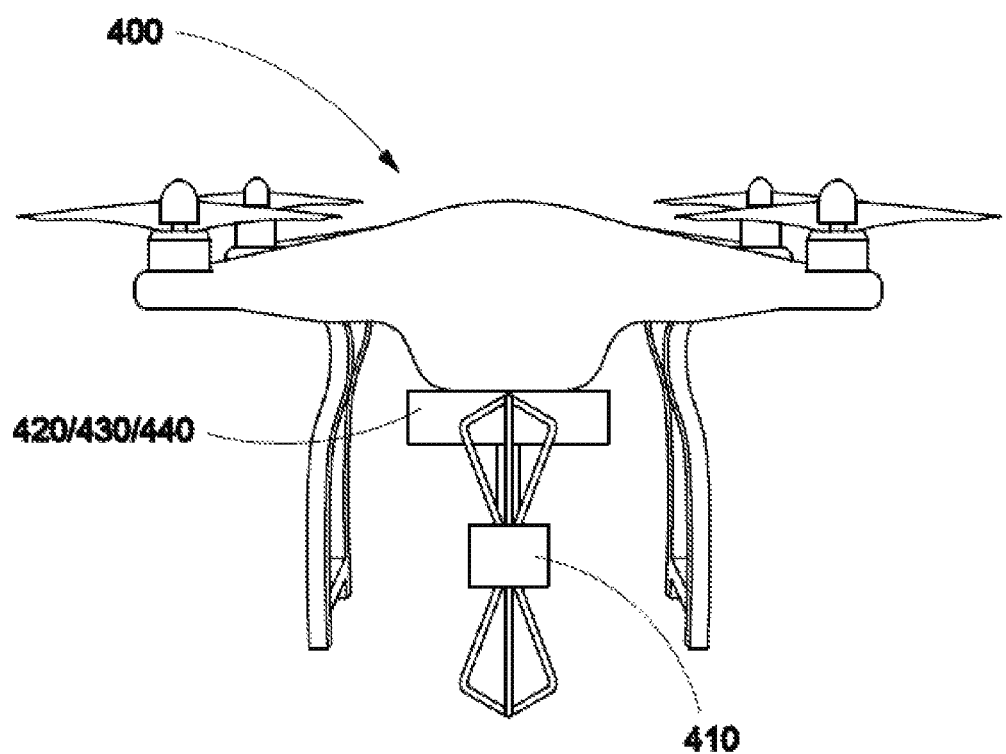
FIG. 4 is a view of a drone in accordance with example embodiments.

The following is an example application of applicant's invention. In this example, a user desires to measure the free-space properties of an antenna 100 having a length of about thirty (30) meters and a resonant frequency of about one hundred (100) MHz. The user desires to use the system 1000 of FIGS. 2-4. In order to avoid the effects of the ground, the user calculates the distance the antenna 100 should be suspended from the ground (Step 3100). In one nonlimiting example embodiment, this distance may be determined by calculating the Fraunhofer distance which is defined as $d_f=2D^2\lambda$. In this case, $\lambda$ of the electromagnetic field generated by the antenna 100 is about 3.0 m=$(3\times10^8$ m/s)/(100 MHz) which is the speed of light divided by the frequency of the electromagnetic field in HZ generated by the antenna 100. The Fraunhofer distance is then calculated as 600 m=$2*(30$ m$)^2/3$ m. The user then tethers the antenna 100 to the aircraft 200 and elevates the antenna 100 to a height of about 600 m or greater (Step 3200). The user then causes the antenna's onboard analyzer 105 to take a measurement of the antenna 100 to determine the free-space properties of the antenna 100 (step 3300). For example, the user may send a signal to the antenna 100 which causes the analyzer 105 to take measurements, for example, an S11 measurement of the antenna 100.

In the event the user wishes to determine additional properties of the antenna 100, for example, the antenna's gain, the user may utilize the method outlined in FIG. 8. As in the previous example, a height at which the antenna 100 should be suspended from the ground may be calculated using the Fraunhofer equation (Step 4100) and the antenna 100 may be elevated to this distance above the ground (or greater) by an aircraft (Step 4200). Once properly elevated, the antenna 100 may be controlled to emit a signal (Step 4300). For example, the signal generated by the antenna 100 is controlled by an onboard signal generator which causes the antenna 100 to generate a signal. The drone 400 may be controlled so that it flies around the antenna 100 while the antenna 100 generates the signal to take measurements associated with the signal (step 4400). The drone 400, for example, may be programmed with a prerecorded flight path which may be updated in real-time based on the position of the drone 400 with respect to the antenna 100, noting the position of the drone 400 and the antenna 100 may be known in real time due to the presence of the global positioning devices thereon. The drone 400 may then take measurements of the antenna's emitted signal and the measurements and position of the drone 400 can be recorded so the user can understand various characteristics of the antenna 100 while it is generating a signal. In this example method, the drone 400 may be controlled so that measurements are taken in the antenna's 100's far field region.

It is understood that example embodiments include elements which are common in the art and which may be implemented with the disclosed methods and devices to fully enable them. For example, the drone 400 may include a communication system which allows the drone 400 to be remote controlled by a user. Similarly, the antenna 100 may be fitted with a communication system which enables a user to control various elements associated with the antenna 100. For example, the signal generator and/or analyzer 105 may be remote controlled by a user so that the user controls when the signal generator energizes the antenna 100 or when the analyzer 105 takes measurements of the antenna 100. As yet another example, a height to which an antenna 100 may be raised may be determined by several conventional means including but not limited to, GPS (for example, differential GPS), barometer, and radars. However, a detailed description thereof is omitted for the sake of brevity.

Example embodiments of the invention have been described in an illustrative manner. It is to be understood that the terminology that has been used is intended to be in the nature of words of description rather than of limitation. Many modifications and variations of example embodiments are possible in light of the above teachings. Therefore, within the scope of the appended claims, the present invention may be practiced otherwise than as specifically described.

I claim:

1. A system for measuring free space properties of an antenna, comprising:
    an analyzer adapted to obtain from an antenna supported in air by an aircraft, at least one property of the antenna, and to determine at least one property of the antenna, wherein the antenna is supported so that a distance from a focal point of the antenna and ground is about a Fraunhofer distance or greater;
    a telemetry unit adapted to relay information from the analyzer to a ground station; and
    a drone adapted to move around the antenna and to take measurements of the antenna at a plurality of locations.

2. The system of claim 1, wherein the aircraft is an aerostat.

3. The system of claim 1, wherein the aircraft is a powered device.

4. The system of claim 1, wherein a parameter is S11.

5. The system of claim 1, wherein the analyzer is a vector network analyzer.

6. The system of claim 1, wherein the drone measures at least one of radiation and gain from the antenna at a plurality of locations.

7. The system of claim 6, wherein the plurality of locations are disposed in a hemispherical pattern.

8. The system of claim 1, wherein the drone comprises a global positioning device to determine a location of the drone.

9. The system of claim 1, wherein the plurality of locations are at least a Fraunhofer distance from the antenna.

10. The system of claim 1, wherein the analyzer is adapted to obtain a location of the antenna to obtain a plurality of locations of the drone corresponding to the plurality of locations.

11. The system of claim 1, wherein the antenna is tethered to the aircraft via a cable.

12. The system of claim 1, wherein the antenna is supported vertically to position nulls of a radiation pattern of the antenna downward in a direction of ground and upwards in a direction of the aircraft.

13. The system of claim 1, further comprising a tower configured to support the antenna.

14. The system of claim 13, wherein the tower comprises a first substructure and a second substructure.

15. The system of claim 14, wherein the first and second substructures each comprise electrically nonconductive materials to minimize electromagnetic interaction between the tower and the antenna.

16. The system of claim 1, wherein the at least one property is a Voltage Standing Wave Ratio (VSWR).

17. The system of claim 1, wherein the at least one property is a Free Space Input Impedance of the antenna in free-space.

* * * * *